United States Patent [19]
Imai et al.

[11] Patent Number: 5,686,151
[45] Date of Patent: Nov. 11, 1997

[54] METHOD OF FORMING A METAL OXIDE FILM

[75] Inventors: Keitaro Imai, Kawasaki; Masahiro Kiyotoshi, Matsudo; Haruo Okano, Tokyo, all of Japan

[73] Assignee: Kabushiki Kaisha Toshiba, Kawasaki, Japan

[21] Appl. No.: 603,198

[22] Filed: Feb. 20, 1996

Related U.S. Application Data

[63] Continuation of Ser. No. 305,900, Sep. 14, 1994, abandoned.

[30] Foreign Application Priority Data

Sep. 14, 1993 [JP] Japan .................... 5-229277
Mar. 30, 1994 [JP] Japan .................... 6-060400

[51] Int. Cl.$^6$ .................... B05D 3/06; C23C 16/00
[52] U.S. Cl. .................... 427/576; 427/255.3; 427/126.3; 427/62; 505/447; 505/477; 505/734
[58] Field of Search .................... 427/576, 569, 427/126.3, 255.3, 62; 505/447, 477, 446, 445, 734

[56] References Cited

U.S. PATENT DOCUMENTS

| | | | |
|---|---|---|---|
| 4,771,015 | 9/1988 | Kanai et al. | 427/574 |
| 5,124,180 | 6/1992 | Proscia | 427/255.3 |
| 5,262,396 | 11/1993 | Yamazaki | 505/1 |

FOREIGN PATENT DOCUMENTS

| | | |
|---|---|---|
| 63-178408 | 7/1988 | Japan . |
| 63-303070 | 12/1988 | Japan . |
| 2-85370 | 3/1990 | Japan . |
| 3-37101 | 2/1991 | Japan . |
| 3-174304 | 7/1991 | Japan . |

OTHER PUBLICATIONS

Chern et al, Appl. Phys. lett. 56 (23) Jun. 1990, pp. 2342–2344.
Chern et al, Appl. Phys. lett. 58(2) Jan. 1991, pp. 185–187.
Chern et al, Appl. Phys. lett. 57(7) Aug. 1990, pp. 721–723.
Zama et al, Jpn. J. Appl. Phys. vol. 31, Part 1, No. 12A, Dec. 1992, pp. 3839–3843.
Chern et al, Appl. Phys. lett. 60(9) Mar. 1992, pp. 1144–1146.
Ebihara et al, J. Appl. Phys. 68(3) Aug. 1990, pp. 1151–1156.
Wills et al, Appl. Phys. lett. 60(1) Jan. 1992, pp. 41–43.

*Primary Examiner*—Roy V. King
*Attorney, Agent, or Firm*—Oblon, Spivak, McClelland, Maier & Neustadt, P.C.

[57] ABSTRACT

Disclosed is method of forming a metal oxide film including the steps of introducing a gas containing a metal compound having at least one element selected from the group consisting of carbon and a halogen element, into a process chamber accommodating a substrate, introducing a gas containing a compound having a hydroxyl group into the process chamber, introducing a gas containing oxygen which has been converted to a plasma state, into the process chamber, and forming the metal oxide film on the substrate using the gas containing a metal compound, the gas containing a compound having a hydroxyl group, and the gas containing oxygen which has been converted to a plasma state.

23 Claims, 8 Drawing Sheets

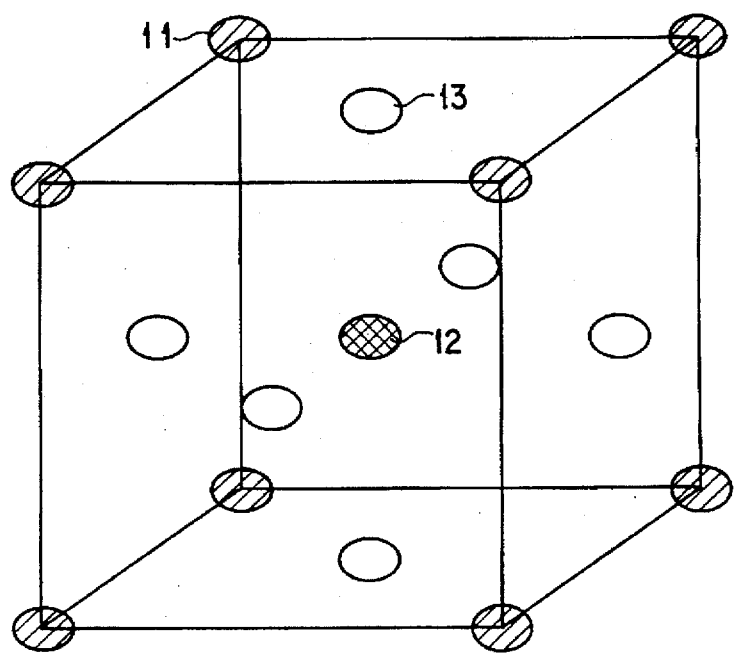
F I G. 1
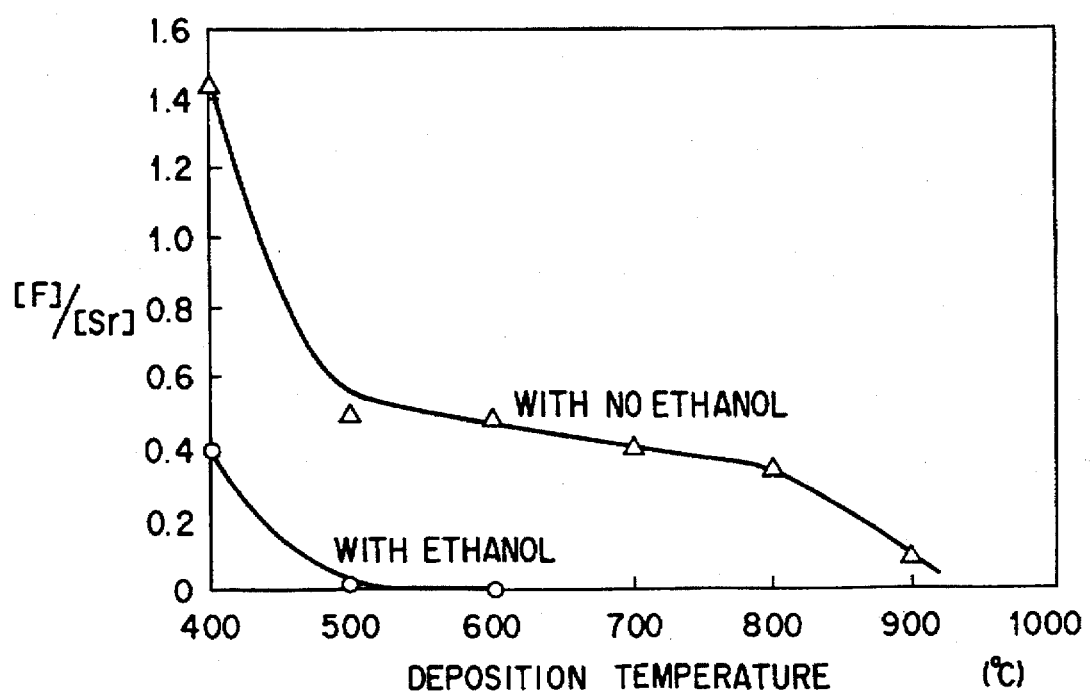
F I G. 2

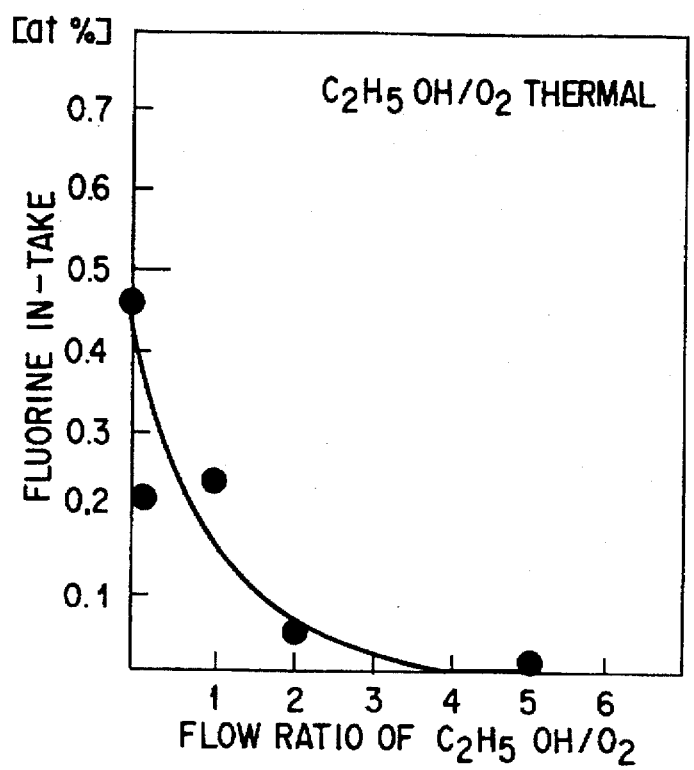
F I G. 3
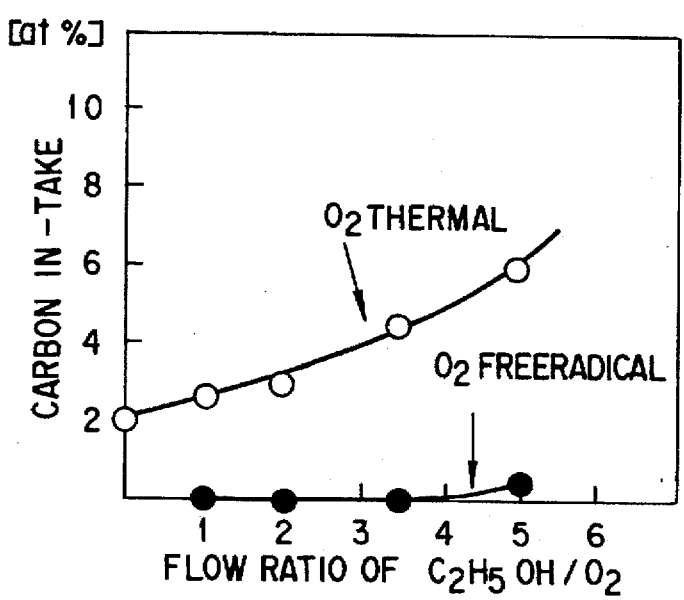
F I G. 4

METHOD OF FORMING A METAL OXIDE FILM

This application is a Continuation of application Ser. No. 08/305,900, filed on Sep. 14, 1994, now abandoned.

BACKGROUND OF THE INVENTION

1. Field of the Invention

The present invention relates to a method of forming a metal oxide film, and more particularly, to a method of forming a metal oxide film for use as an insulation film of semiconductor devices.

2. Description of the Related Art

A Dynamic Random Access read write Memory (DRAM) is a semiconductor device and is known as a semiconductor memory device for storing information. The DRAM comprises capacitors and transistors in combination. The capacitors of conventional DRAMs have a silicon oxide film as an insulation film interposed between a pair of electrodes. The capacitors are increasingly shrinked to enhance the integration density of semiconductor elements. The miniaturization of the capacitors accompanies reduction in the capacitance of each capacitor. In order to compensate for the reduction of the capacitance, research has been conducted to see if a film formed of a material having a dielectric constant higher than that of the silicon oxide can be used as an insulation film. In an attempt to obtain such an insulation film, for example, a laminated film formed of a silicon nitride film and a silicon oxide film has been experimentally used. To provide a capacitor of a higher capacitance, it was studied as to whether or not a film made of a material having a dielectric constant higher than those of silicon nitride and silicon oxide can be used as an insulation film. To impart a higher capacitance to a capacitor so as to meet the increasing demand for miniaturization of the capacitor, it is very important to use a film made of a material having as high a dielectric constant as possible.

Research is conducted on films made of high dielectric materials having the perovskite-type crystal structure, such as strontium titanate, barium titanate, PZT each having a dielectric constant 20 to 1000 times higher than that of silicone oxide. FIG. 1 shows the perovskite-type crystal structure. In FIG. 1, reference numeral 11 denotes an A-site atom of the perovskite-type crystal structure ($ABO_3$), for example, St, Ba, and Pb. Reference numeral 12 denotes a B-site atom, e.g., Ti, and 13 is an oxygen atom (O). Metal oxides of the perovskite-type crystal structure are known to generate atomic polarization, thereby inducing high dielectric constants. The atomic polarization is ascribed to a high degree of displacement caused by a central atom in a crystal lattice. Hence, to attain a high dielectric constant of the metal oxide, it is inevitable that the perovskite-type crystal structure is formed in good order.

On the other hand, when such a metal oxide film having a high dielectric constant is applied to a capacitor insulation film of a DRAM, it is necessary to form the metal oxide film by a film formation method which provides a film readily covering the capacitor even if the capacitor has a three-dimensional structure like a trench capacitor, a stacked capacitor, or the like. For such a film formation method, the low pressure chemical vapor deposition (LPCVD) method is suitable. To form the metal oxide film having a high dielectric constant by means of the LPCVD method or the like, an organometallic compound is generally employed as raw material. Since the organometallic compound is often used with an alkoxide group bond, the resultant metal oxide film inevitably contains a number of carbon atoms and hydrogen atoms to one metal atom. The metal oxide film is therefore contaminated with carbon.

Since metal atoms such as Sr, Ba, and Cu are difficult to vaporize in the form of an alkoxide compound. A high molecular-weight organic compound such as organic compounds of acetyl acetonate series e.g., β-diketone or the like are coordinated to the metal atom to make a metal complex [$Sr(dpm)_2$, or $Ba(dpm)_2$, where dpm is dipivaloyl methanate], thereby facilitating the vaporization of the metal atoms. In this case, however, carbon is taken in the metal oxide film in the same manner as above. Further, even though such a large molecular-weight metal complex in which organic compounds are coordinated to a metal atom, is used, up to now, high vapor pressure applicable to the chemical vapor deposition method (CVD method) have not yet been obtained at room temperature.

To vaporize a metallic material of the Group IIa in the Periodic Table (hereinafter referred to as "the Group IIa") such as Sr or Ba, it is required that the metallic material be maintained at a high temperature of 150° C. or more. To maintain the temperature, a main portion of a film formation apparatus including raw-material tanks, supply lines, and valves has to be heated to at least 150° C., while quite a large volume of bubbling gas is provided. As a result, the film formation apparatus suffers a great load.

In the case where the metallic material of the Group IIa is used, an organometallic compound ($Sr(hfa)_2$, $Ba(hfa)_2$, where hfa is hexafluoro acetyl acetonate) which is easily vaporized owing to its relatively high vapor pressure, can be obtained by introducing a halogen element such as fluorine into the molecules of the organic compound used as a ligand. On the other hand, a halide of the Group IIa metal such as $SrI_2$ exhibits not only a higher vapor pressure compared to that of the Group IIa organometallic compound containing no halogen but also thermal stability. However, if the Group IIa metal is subjected to the CVD method using oxygen as an oxidizing agent in a relatively lower-temperature range, a substance containing a halide of the Group IIa metal or a carbonate will be formed instead of the Group IIa metal oxide. This is because the halide of the Group IIa metal is present in a thermodynamically more stable form than that of the Group IIa metal oxide.

To solve the above-mentioned problems, a metal oxide film is formed by removing a halogen according to the CVD method using $H_2O$ and $O_2$ as oxidizing agents (L. A. Wills and B. W. Wessels, Mat. Res. Soc. Symp. Proc. Vol. 243, p217, 1992). In this CVD method, however, a film is formed at a high temperature of 800° C. or more. The CVD method therefore fails to meet the requirement for a low temperature process which is indispensable to further miniaturization. In addition, in the case where a film made of a material having a high dielectric constant is used as a capacitor, it is considered preferable that a metal such as platinum be used as one (a lower electrode) of the electrodes in order to avoid oxidation. Since adhesion between such a metal and a substrate is weak, there is a high risk of the film being stripped off when exposed to a high temperature of 800° C. or more. For this reason, a process of the high temperature of 800° C. or more is undesirable. In the case where the metal oxide film of the perovskite-type crystal structure having a high dielectric constant is formed at lower temperature, a halogen atom is inevitably taken in the metal oxide film as an impurity.

Such contamination of the metal oxide film with an impurity results in the inhibition of the formation of the perovskite-type crystal structure. Consequently, the dielectric constant and the insulation characteristic of the metal oxide film deteriorate, lowering the ability of the metal oxide film for accumulating and holding electrons. Hence, conventional DRAMs, formed by the aforementioned process employing, as a capacitor insulation film, a metal oxide film of the perovskite-type crystal structure, have the drawback that the electron holding ability of a capacitor decreases on the basis of lower dielectric constant, and have but low reliability due to the fact that a leak current increases.

SUMMARY OF THE INVENTION

It is an object of the present invention to provide a method of efficiently forming a metal oxide film to be used as a capacitor insulation film which has a high dielectric constant and which is not contaminated with impurities.

This object can be attained by the method of forming a metal oxide film comprising the steps of: introducing a gas containing a metal compound having at least one element selected from the group consisting of carbon and a halogen element, into a process chamber accommodating a substrate; introducing a gas containing a compound having a hydroxyl group into the process chamber; introducing a gas containing oxygen of a plasma state into the process chamber; and forming a metal oxide film on the substrate using the gas containing a metal compound, the gas containing a compound having a hydroxyl group, and the gas containing oxygen of a plasma-state.

Further, this object can be achieved by the method of forming a metal oxide film comprising the steps of: preparing a mixed gas comprising a gas containing a metal compound having at least one element selected from the group consisting of carbon and a halogen element, a gas containing a compound having a hydroxyl group, and a gas containing oxygen; exciting the mixed gas to produce a plasma; introducing the plasma into a process chamber accommodating a substrate; and forming a metal oxide film on the substrate using the plasma.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a view of the perovskite-type crystal structure;

FIG. 2 is a graph showing the relationship between the deposition temperature and the ratio of fluorine (F)/strontium (Sr);

FIG. 3 is a graph showing the relationship between the flow rate of $CH_3OH/O_2$ and the amount of fluorine in the film;

FIG. 4 is a graph showing a flow rate of $CH_3OH/O_2$ and the amount of carbon in the film;

DETAILED DESCRIPTION OF THE PREFERRED EMBODIMENTS

Figure 5:
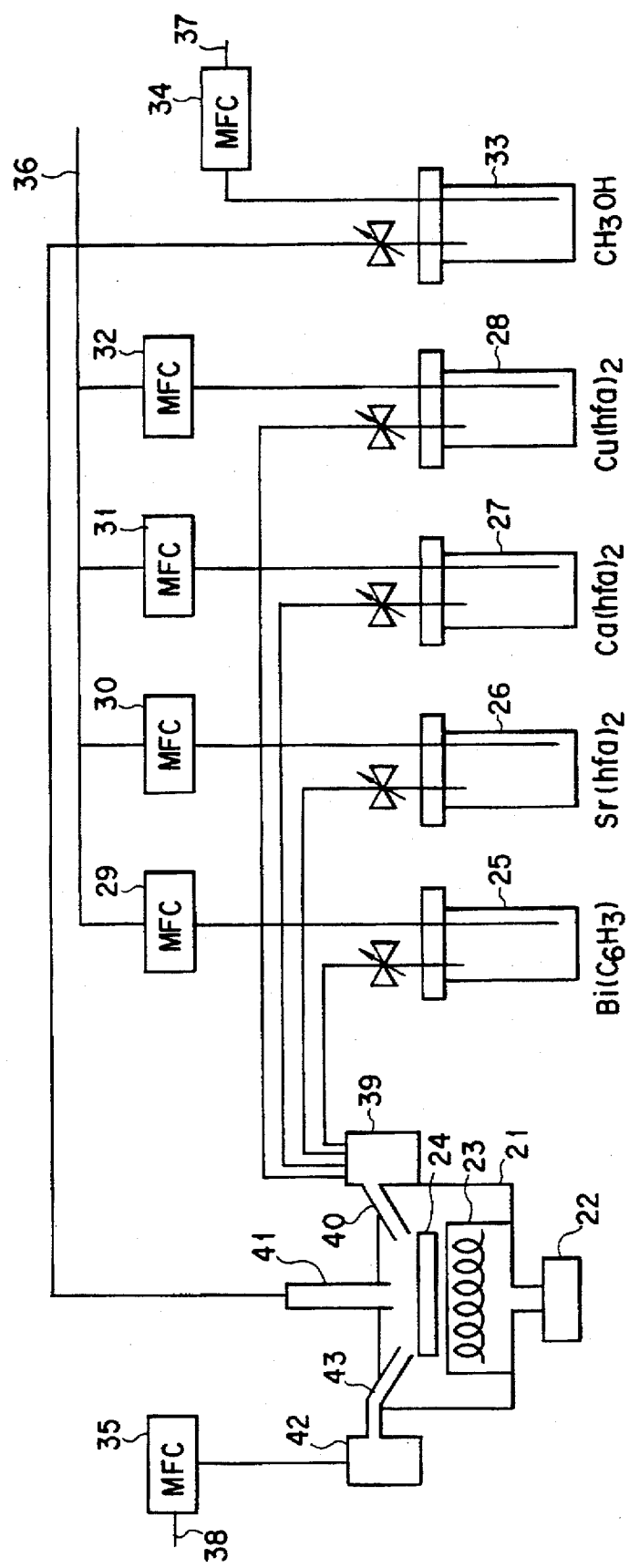
FIG. 5 is a schematic view showing the structural constitution of the film-forming apparatus for the metal oxide film according to Example 1 of the present invention.

The present invention provide a method enabling to form a metal oxide film containing less amount of impurities by performing CVD at low temperature using a gas containing a metal compound (organometallic compound) having at least one element selected from the group consisting of carbon and a halogen element and a gas containing a compound having a hydroxyl group.

The compound containing a hydroxyl group herein is preferred to be an alcohol and/or $H_2O$. The metal oxide film herein is preferred to be formed of a material having the perovskite type crystal structure, particularly strontium titanate, barium titanate, calcium titanate, or a mixture of at least two compounds selected from the above-mentioned three compounds. Further, it is preferred that the metal oxide film be formed of a superconductive material. To efficiently remove a halogen element from the metal oxide film, it is preferred that a gas containing a compound having a hydroxyl group be introduced into a process chamber in at least two times of that of a gas containing a metal compound.

In the present invention, a halogen atom such as a fluorine is suppressed to bind to a metal in a relatively low temperature range of 500 to 800° C. by virtue of employing a gas containing a metal compound having carbon and/or a halogen element and a gas containing a compound having a hydroxyl group. Consequently, the halogen atom is efficiently removed from the metal, resulting in a metal oxide with no halogen atom.

For example, FIG. 3 shows the relationship between the flow ratio of the ethyl alcohol gas/the oxygen gas and the ratio of fluorine (F) atoms in amount taken in the strontium titanate film (expressed in terms of a ratio relative to strontium (Sr)), when a strontium titanate film is formed from raw material gases, an $Sr(hfa)_2$ gas and a Ti (iso-$C_3H_7O)_4$ gas while the vapor of ethyl alcohol ($CH_3OH$) bubbled with an oxygen gas is supplied to a process chamber. FIG. 3 demonstrates that with increase of the amount of ethyl alcohol, the amount of fluorine in-take decreases. From this, it is apparent that fluorine atoms can be removed from the strontium titanate film by the addition of the ethyl alcohol gas. Any organic compound having a hydroxyl group can be expected to remove fluorine atoms. Other than ethyl alcohol, it has been confirmed that methyl alcohol, n-propylalcohol, or the like removes fluorine atoms.

By use of the alcohol gas, a halogen atom such as a fluorine atom present in the raw material gas can be suppressed to remain in the film at low film-forming temperature. However, in the case where CVD is performed using only an alcohol gas, a large amount of carbon (C) generated from the decomposition of the alcohol is taken in a deposited strontium titanate film. More specifically, in the case where the strontium titanate film is formed from the above-mentioned materials by raising a flow rate of an ethyl alcohol gas in order to prevent the contamination with fluorine atoms, as shown in FIG. 4, the amount of carbon atoms contaminating the film increases, particularly, to several % in terms of carbon atoms. As is in this case, when the carbon atoms are taken in the strontium titanate film to the level of several percentages in terms of atom, the dielectric constant of the film decreases. In the case, if the metal oxide film is a superconducting film, the critical temperature (Tc) of the film decreases. As described above, the alcohol gas acts merely an agent accelerating removal of the halogen atoms. Hence, if an alcohol gas alone is provided, carbon atoms decomposed from the alcohol itself are conversely taken in the film. It is, then, necessary to supply a gas working as an oxidizing agent.

As a result of intensive and extensive studies conducted by the present inventors, it was confirmed that the amount of carbon taken in the film can be drastically reduced by converting an oxygen gas to a plasma gas state and supplying in the form of an active oxygen free-radical.

Further, the present inventors found that a metal oxide film can be formed which is free from not only carbon atoms but also contamination with impurities such as halogen atoms, by virtue of hydroxyl groups or OH free-radicals obtained from a gas containing a compound having an OH group. The hydroxyl groups or the OH free-radicals can be obtained by exciting the gas containing a compound having a hydroxyl group to produce a plasma. In the case of alcohols, which have hydroxyl groups in their molecules, the hydroxyl groups can be relatively easily dissociated from the alcohols. Such hydroxyl groups are likely to react with an organic metal, thereby facilitating the dissociation of the metal atoms. This mechanism will be further explained by way of example of Sr(hfa)$_2$ as an Sr chelate compound.

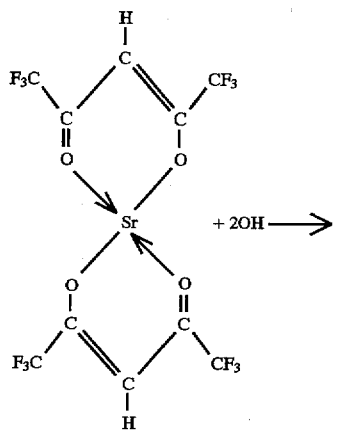

-continued

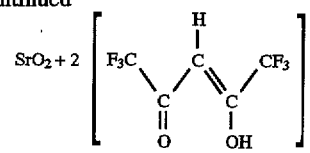

As shown above, a hydroxyl group actively binds to a ligand, thereby facilitating the dissociation of a metal atom. However, the ligand itself is not decomposed. Other than Sr(hfa)$_2$, the similar reaction as above takes place in the case of Sr(dpm)$_2$ or a number of organic metals.

The hydroxyl group or the OH free-radical reacts with a halogen atom, thereby removing the halogen atom efficiently. Further, since the hydroxyl group or the OH free-radical reacts with a decomposition product of an organometallic compounds, the decomposition product is also efficiently removed. In this mechanism, the contamination of the film with halogen atoms and carbon atoms can be successfully inhibited, thereby preventing a decrease in the dielectric constant of the film.

Hereinbelow, the present invention will be explained with reference to Examples and drawings.

(EXAMPLE 1)

FIG. 5 is a schematic view showing a structural constitution of a film-forming apparatus employed in forming a superconducting film (Bi—Sr—Ca—Cu—O) according to Example 1 of the present invention. Reference numeral 21 in FIG. 5 denotes a process chamber. The process chamber 21 is evacuated by evacuation means such as a vacuum pump 22 or the like. In the process chamber 21, a mounting table 23 is placed which houses heating means such as a heater. On the mounting table 23, a substrate 24 is mounted which is designed to be heated by the heating means. In this Example, a superconducting film is formed on the substrate 24 by means of the organometallic chemical vapor deposition (MOCVD) method. As a material for the substrate 24, a monocrystal of magnesium oxide (MgO), strontium titanate (SrTiO$_3$), yettria stabilized zirconium (YSZ), sapphire (Al$_2$O$_3$), or the like was used.

To the process chamber 21, a plurality of supply lines for providing treatment gases from the outside are connected. More specifically, an Ar supply line 36, a first O$_2$ supply line 37, and a second O$_2$ supply line 38 are connected to the process chamber 21. The Ar supply line 36 is connected also to a first raw material tank 25 enclosing Bi(C$_6$H$_5$)$_3$ as a precursor for Bi, to a second raw material tank 26 enclosing Sr(hfa)$_2$ as a precursor for Sr, to a third raw material tank 27 enclosing Ca(hfa)$_2$ as a precursor for Ca, and to a fourth raw material tank 28 enclosing Cu(hfa)$_2$ as a precursor for Cu. The first O$_2$ supply line 37 is also connected to a tank 33 enclosing a CH$_3$OH gas as a raw material for a compound containing a hydroxyl group.

To branched lines of the Ar supply line 36 to the first to fourth tanks, mass-flow controllers 29, 30, 31, and 32 are respectively provided in order to control a gas flow. The Ar gas flows respectively controlled by the mass-flow controllers 29, 30, 31, and 32, are introduced to the first to fourth raw material tanks and vaporize individual raw materials in the tanks. The individually vaporized raw material gases are collected in a gas mixing vessel 39 by opening and shutting of valves, and then, supplied to the process chamber 21 through a gas nozzle 40.

To the first O$_2$ supply line 37, a mass flow controller 34 is provided. The O$_2$ gas flow controlled by means of the mass-flow controller 34 is introduced into the tank 33 enclosing CH₃OH and vaporizes CH₃OH. The vaporized CH₃OH gas is supplied to the process chamber 21 through a gas nozzle 41. The O₂ gas herein is used as a carrier gas, because the O₂ gas can be mixed well with an alcohol such as CH₃OH. An Ar gas may be used as a carrier gas. To the second supply line 38, a mass-flow controller 35 is provided. The O₂ gas flow controlled by means of a mass-flow controller 35 is introduced into a microwave discharge chamber 42, in which the gas is excited with a high energy application to produce oxygen free-radicals. The thus-generated oxygen free-radicals are supplied to the process chamber 21 through a gas nozzle 43.

Hereinbelow, a method of forming a superconducting film (Bi—Sr—Ca—Cu—O) using the film-forming apparatus having the aforementioned structural constitution will be explained. First, the temperature of the process chamber 21 was set to about 150° C. and the inner pressure of the process chamber 21 was set to about 133 Pa by means of the evacuating means. The substrate 24 was maintained in a temperature range of 500° to 800° C. by means of a heater, and the first to fourth tanks 25, 26, 27, and 28 were maintained at 120° C., 140° C., 140° C., and 140° C., respectively. Under these conditions, $Bi(C_6H_5)_3$, $Sr(hfa)_2$, $Ca(hfa)_2$, and $Cu(hfa)_2$ were supplied to the process chamber 21 at a flow rate of 20 sccm, 50 sccm, 50 sccm, and 20 sccm, respectively, together with a carrier gas (Ar gas).

Second, an O₂ gas was introduced into the microwave discharge chamber 42 through the supply line 38 at a flow rate of 50 sccm, and then, the microwave of 9.45 GHz in frequency and 500 W in power was discharged to the O₂ gas in order to generate oxygen free-radicals. While the thus-generated oxygen free-radicals were being supplied to process chamber 21, a mixture of a methanol (CH₃OH) gas (a flow rate of 250 sccm) as an agent accelerating the dissociation of halogen atoms of a raw organometallic compound and an oxygen gas (a flow rate of 50 sccm) as an oxidizing agent were introduced into the process chamber 21 via another route. In this way, the superconducting film (Bi—Sr—Ca—Cu—O) was formed on the substrate 24.

An amount of atoms of impurities present in the thus-obtained superconducting film was analyzed. As a result, fluorine atoms were present in an amount of 0.1% or less and carbon atoms in an amount of 0.2% or less in terms of atom. The critical temperature of the film was 100K. These data demonstrated that the superconducting film had good characteristics. As is apparent from the above data that carbon atoms were efficiently removed from the superconducting film. This is because oxygen free-radicals obtained by the microwave discharge, efficiently removed the decomposition product of the alcohol by immediately reacting it as soon as it was produced. Fluorine was also efficiently removed from the superconducting film. This is because methanol suppressed the remaining of fluorine atoms in the film when the film was formed at low temperature. In addition, by virtue of employing a material such as $Sr(hfa)_2$ having high vapor pressure, a film formation rate was able to increase from conventional 100 nm/h to 50 μm/h. Further, since the inner temperature of the process chamber successfully controlled at 150° C. or less, parts of the film-forming apparatus were able to avoid deterioration.

In this Example, as raw materials of Bi, Sr, Ca, and Cu, $Bi(C_6H_5)_3$, $Sr(hfa)_2$, $Ca(hfa)_2$, and $Cu(hfa)_2$ were respectively used. However, the same results as above can be obtained if precursors other than those mentioned above were used. For example, $Sr(fod)_2$ (fod stands for heptafluoro dimethyllactane dionate), or $SrI_2$ can be used as a precursor for Sr, and as a precursor for Ca, $Ca(fod)_2$ can be used. In this Example, the formation of the superconducting film of the Bi—Sr—Ca—Cu—O series was explained in this Example. However, if a superconducting film was formed of other formulation such as a Y—Ba—Cu—O series, the critical temperature of 100K was realized and a temperature of raw material organometallic compound was able to be suppressed to at most 160° C. In this Example, although the case was explained where plasma is generated by means of microwave discharge, the same effects as this can be obtained if other means, e.g., Radio Frequency (RF) is used.

(EXAMPLE 2)

Figure 6A:
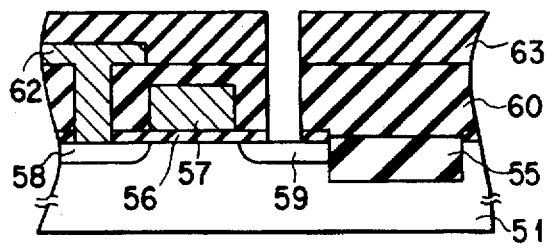
FIGS. 6A, 6B and 6C are cross-sectional views showing a manufacturing process of the DRAM according to Example 2 of the present invention.
Figure 6B:
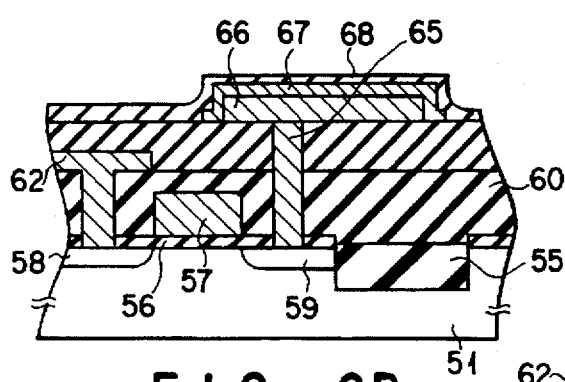
Figure 6C:
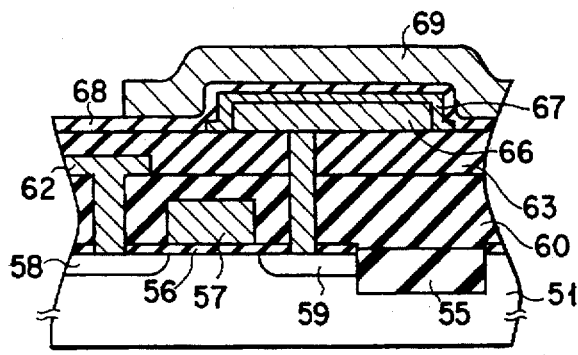

FIGS. 6A to 6C are cross-sectional views showing a manufacturing process of the DRAM according to Example 2 of the present invention. In this Example, the case will be explained where a strontium titanate film was applied to an capacitor insulation film of the DRAM.

First, as shown in FIG. 6A, an insulation film 55 for isolation was formed by thermal oxidation on a silicon substrate 51 made of monocrystalline silicon having a specific resistivity of 4 to 5 Ω.cm and (100) plane. Second, excess silicon thermal-oxidized film was stripped with hydrofluoric acid or the like, and then, a thin gate insulation film 56 was formed by thermal oxidation. Subsequently, a first n⁺-type polycrystalline film was formed on the silicon substrate 51 by means of LPCVD, and then, the film was patterned by means of conventional photolithography and etching, thereby forming a gate electrode 57.

As a next step, n⁻-type source drain diffusion layers 58 and 59 were formed in a self-aligning manner by implanting ions into a silicon substrate 51 with the gate electrode 57 as a mask. After a thick silicon oxide film 60 as a first interlayer insulation film, was formed over the entire surface of the silicon substrate by the CVD method, the thick silicon oxide film 60 was patterned by conventional photolithography and etching, thereby forming an opening communicating with the source drain diffusion layer 58. Thereafter, tungstensilicide was deposited on the silicon oxide film 60 and in the aforementioned opening, followed by patterning by means of conventional photolithography and etching, thereby forming a bit wire 62. Subsequently, a silicon oxide film 63 as a second interlayer insulation film was formed by means of CVD. The silicon oxide films 60 and 63 were patterned by conventional photolithography and etching, thereby forming an opening communicating with a source drain diffusion layer 59.

As shown in FIG. 6B, after a second n⁺-type polycrystalline silicon film 65 was formed over the entire surface of the silicon substrate by the LPCVD method, the film 65 was allowed to remain only in the opening on the source drain diffusion layer 59 by the etchback method. Subsequently, a molybdenum film 66 was formed over the entire surface of the silicon substrate by the sputtering method, followed by patterning by means of conventional photolithography and etching. Further, the annealing treatment was applied thereto at 500° C. to oxidize the surface of the molybdenum film 66, thereby forming a capacitor lower electrode. Thereafter, a niobium-added strontium titanate film 67 was formed by the CVD method over the entire surface of the silicon substrate. The niobium-added strontium titanate film 67 was formed from $Sr(hfa)_2$, $Ti(iso-OC_3H_7)_4$, and $Nb(OC_2H_5)_5$ which were supplied as precursors for Sr, Ti, and Nb at a flow rate of 100 sccm, 40 sccm, and 1 to 2% of the total flow rate, respectively to the process chamber while being bubbled with the Ar gas. In this film formation process, the inner temperature and pressure of the process chamber were set to 150° C. and 133 Pa, respectively.

The niobium-added strontium titanate film 67 was then processed by the reactive ion-etching method and the film 67 was allowed to remain only on the lower electrode. Thereafter, a strontium titanate film 68 was formed over the entire surface of the silicon substrate by the CVD method. The strontium titanate film 68 was formed from $Sr(hfa)_2$ and $Ti(iso-OC_3H_7)_4$ which were supplied precursors for Sr and Ti at a flow rate of 100 sccm and 40 sccm, respectively to the process chamber while being bubbled with Ar gas. In this film formation process, the inner temperature and pressure of the process chamber were set to 150° C. and 133 Pa, respectively. In addition, as an agent accelerating dissociation of halogen atoms of the precursors for the organometallic compound, an ethanol ($C_2H_5OH$) gas (a flow rate of 250 sccm) was supplied to the process chamber through an another route of the raw material for the organometallic compound supply one. Further, an oxygen gas as an oxidizing agent was converted into a plasma-state gas in order to generate oxygen free-radicals by microwave discharge (a flow rate of 50 sccm) of 2.45 GHz in frequency and 50 W in power. The thus-generated oxygen free-radicals were supplied to the process chamber together with the above-mentioned raw material gases.

Finally, as shown in FIG. 6C, a nickel film 69 was formed over the entire surface of the silicon substrate, followed by patterning by means of conventional photolithography and etching, thereby forming a capacitor upper electrode. In this way, a basic structure of a memory cell was completely formed. Thereafter, a DRAM was manufactured in accordance with a manufacturing process of a conventional LSI, through a passivation film forming step, a wire forming step, and the like. The thus-obtained DRAM, owning to the fact that its metal oxide film as a capacitor insulation film had the perovskite-type crystal structure in good order, had a high electron holding ability and therefore the reliability thereof was high.

In this Example, a case was explained where the strontium titanate film was used as a capacitor insulation film. However, the same effect as this can be expected even if, for example, a film made of a material such as PZT having a high dielectric constant is used as a capacitor insulation film. The electrode material is not restricted to niobium-added strontium titanate or nickel. Other electrode materials can be used as the electrode material. Further, the capacitor structure is not also limited to a stacked capacitor structure. The present invention can be applied to a trench capacitor structure.

(EXAMPLE 3)

Figure 7A:
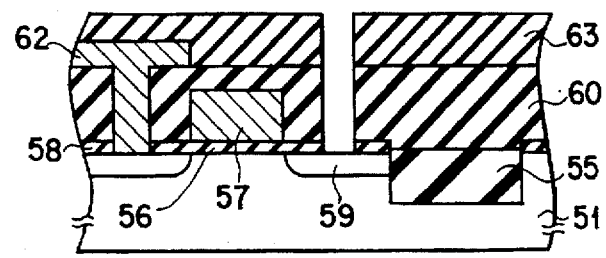
FIGS. 7A, 7B and 7C are cross-sectional views showing a manufacturing process of the DRAM according to Example 3 of the present invention.
Figure 7B:
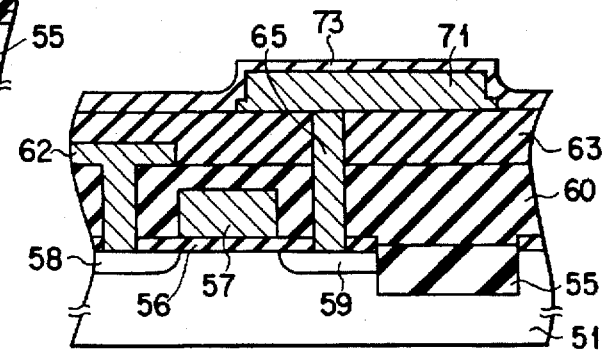
Figure 7C:
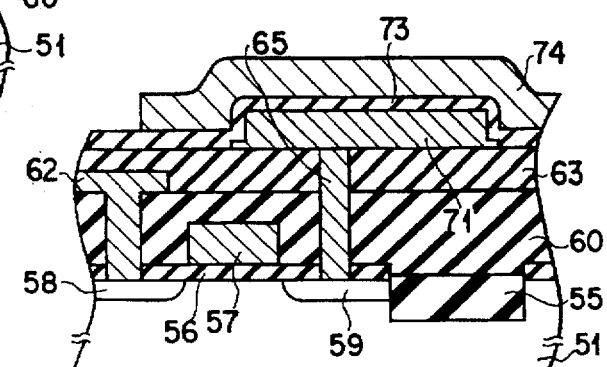

FIGS. 7A to 7C are cross-sectional views showing a manufacturing process of the DRAM according to Example 3 of the present invention. In this Example, the case will be explained where a barium titanate film was applied to an capacitor insulation film of the DRAM.

As shown in FIG. 7A, the insulation film 55 for isolation, the gate insulation film 56, the gate electrode 57, the source drain diffusion layers 58 and 59, the silicon oxide film 60 as a first interlayer insulation film, the opening communicating with the source drain diffusion layer 58, and the bit wire 62 were formed in the same manner as in Example 2. Thereafter, the thick silicon oxide film 63 as a second interlayer insulation film was formed by the CVD method, and then, the opening communicating with the source drain diffusion layer 59 was formed.

As shown in FIG. 7B, after the $n^+$-type polycrystalline silicon film 65 was formed by the LPCVD method, the film 65 is allowed to remain only in the opening on the source drain diffusion layer 59 by the etchback method. Subsequently, an ITO (Indium Tin Oxide) film 71 was formed over the entire surface of the silicon substrate by the sputtering method and purposely permit it to partly project over the silicon oxide film 63, thereby forming a lower electrode. Thereafter, a barium titanate film 73 was formed over the surface of the silicon substrate by the CVD method. When the barium titanate film 73 is formed, since the oxygen free-radicals repair the defects such as oxygen of the barium titanate film, the barium titanate film can be formed having the perovskite-type crystal structure in good order. In this way, the barium titanate film can be obtained having a high dielectric constant.

Hereinbelow, a method of forming a barium titanate film 73 will be explained.

While the oxygen free-radicals are continuously being provided at a flow rate of 50 sccm, a gas mixture of a methanol ($CH_3OH$) gas (a flow rate of 250 sccm) as an agent accelerating the dissociation of halogen atoms of the precursor for the organometallic compound and an oxygen gas (a flow rate of 50 sccm) was independently introduced into the process chamber. Subsequently, the precursor gas of the organometallic compound was introduced into the process chamber while being bubbled with the Ar gas. As the precursors for Ba and Ti, $Ba(hfa)_2$ (a flow rate 100 sccm) and $Ti(iso-OC_3H_7)_4$ (a flow rate of 100 sccm) were used. The carbon atoms contained in the precursors for the organometallic compound were efficiently removed by reacting with the oxygen free-radicals as soon as they were decomposed from the precursor. Fluorine atoms, on the other hand, are also efficiently removed with methanol at a low film-formation temperature.

Finally, as shown in FIG. 7C, a niobium film 74 was formed over the entire surface of the silicon substrate, followed by patterning by means of conventional photolithography and etching, thereby forming an upper electrode. In this way, a basic structure of a memory cell was completely formed. Thereafter, a DRAM was manufactured in accordance with a manufacturing process of a conventional LSI, through a passivation film forming step, a wire forming step, and the like. The thus-obtained DRAM, owning to the fact that its metal oxide film as a capacitor insulation film had the perovskite-type crystal structure in good order, had a high electron holding ability and therefore the reliability thereof was high.

In this Example, a case was explained where the barium titanate film was used as a capacitor insulation film. However, the same effect as this can be expected even if, for example, a film made of a material such as PZT having a high dielectric constant is used as a capacitor insulation film. The electrode material is not restricted to niobium or ITO. Other electrode materials can be used as the electrode material. Further, the capacitor structure is not also limited to a stacked capacitor structure. The present invention can be applied to a trench capacitor structure.

(EXAMPLE 4)

Figure 8:
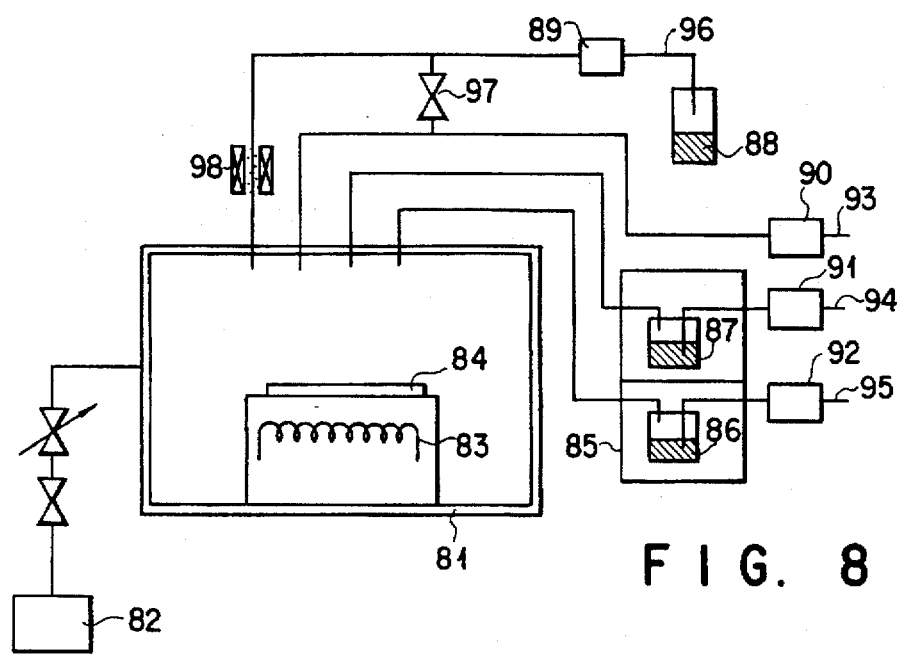
FIG. 8 is a schematic view showing the structural constitution of the film-forming apparatus for the metal oxide film according to Example 4 of the present invention.

FIG. 8 is a schematic view showing a structural constitution of a film-forming apparatus used in forming the metal oxide film (strontium titanate film) according to Example 4 of the present invention. Reference numeral 81 in the FIG. 4, denotes a process chamber. The process chamber 81 is evacuated by evacuation means such as a vacuum pump 82 or the like. In the inside of the process chamber 81, a mounting table 83 housing heating means such as a heater is placed. On the mounting table 83, a substrate 24 is mounted which is designed to be heated by the heating means.

To the process chamber 81, a plurality of supply lines to providing treatment gases from the outside are connected. More specifically, a first carrier Ar line 94 which is connected to a first raw material tank 87 enclosing Sr(dpm)$_2$ as a precursor for Sr, a second carrier Ar line 95 which is connected to a second raw material tank 86 enclosing Ti(iso OC$_3$H$_7$)$_4$ as a raw material for Ti, an O$_2$ line 93, and an H$_2$O line 96 are connected to the process chamber 81. H$_2$O is enclosed in a tank 88 provided with a heater (not shown) thereto. The first and second raw material tanks 86 and 87 are placed and kept at a constant temperature in a thermostat 85. The H$_2$O gas supplied from the H$_2$O line 96 is merged with the O$_2$ gas supplied from the O$_2$ line 93 via a valve 97 and converted into a plasma-state in a microwave discharge apparatus 98, followed by introducing the process chamber 81. To the lines 93, 94, 95, and 96, mass-flow controllers 89, 90, 91, and 92 to control a gas flow are respectively provided.

Hereinbelow, a method of forming a strontium titanate film using the film-forming apparatus having the aforementioned constitution will be explained. First, the temperature of the substrate 84 was maintained in a range from 600° to 800° C. by means of the heater and the temperatures of the first and second raw material tanks 87 and 86 were maintained at 220° C. and 25° C., respectively in the thermostat. Under these conditions, Sr(dpm)$_2$ and Ti(iso-OC$_3$H$_7$)$_4$ were supplied to the process chamber 81 at a flow rate of 100 sccm, and 40 sccm, respectively, together with a carrier gas (Ar gas). At this moment, the tank 88 enclosing H$_2$O was maintained at about 40° C. and the pressure of the process chamber 81 was set to 1 Torr.

Thereafter, the mixed gas of H$_2$O/O$_2$ (H$_2$O:100 sccm, O$_2$: 50 sccm) was converted to a plasma-state by applying a power of 30 to 500 W to the microwave discharge apparatus 98, and introduced into the process chamber 81, followed by forming the strontium titanate film on the substrate 84.

An amount of atoms of impurities present in the thus-obtained strontium titanate film was analyzed. As a result, the strontium titanate film contained extremely less amount of the impurities. It was confirmed that the film had a satisfactory high dielectric constant. This is considered because radicals of oxygen, a hydroxyl group, hydrogen, and the like efficiently removed by reacting with the decomposition product of the precursor for the organometallic compound as soon as it was decomposed; at the same time, the radicals also removed carbon atoms by efficiently reacting therewith. It was confirmed that the same effect as above was obtained in the case where the precursor for the organometallic compound containing fluorine such as Sr(hfa)$_2$ and Ba(hfa)$_2$ was used. Furthermore, according to the method of the present invention, since H$_2$O (water vapor) is supplied, the oxidation reaction is facilitated, and the film formation rate increases.

Although Sr(dpm)$_2$ and Ti(iso-OC$_3$H$_7$)$_4$ were employed as raw materials of Sr and Ti in this Example, the similar effects can be obtained if other raw materials are used. For example, Sr(hfa)$_2$ and the like containing fluorine can be used as a precursor for Sr. Further in this Example, the case is explained where plasma is generated by means of microwave discharge, however, other method, e.g., RF discharge will bring the similar effects.

(EXAMPLE 5)

Figure 9A:
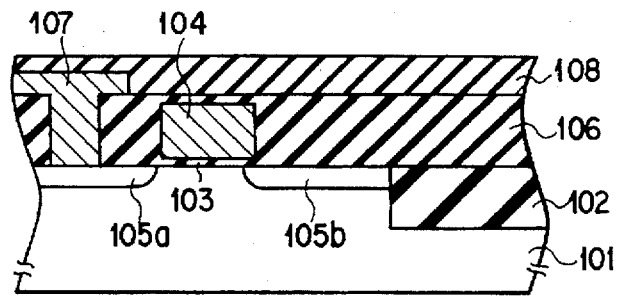
FIGS. 9A, 9B and 9C are cross-sectional views showing a manufacturing process of the DRAM according to Example 5 of the present invention.
Figure 9B:
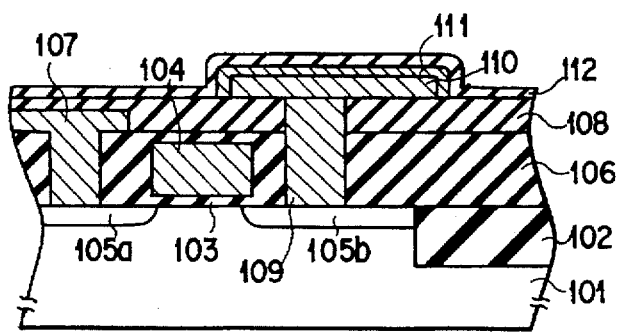
Figure 9C:
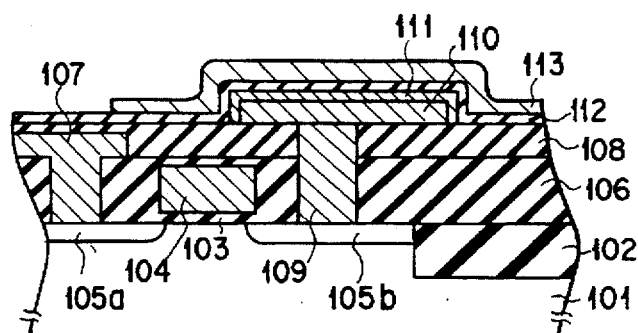

FIGS. 9A to 9C are cross-sectional views showing a manufacturing process of the DRAM according to Example 5 of the present invention. In this Example, the case will be explained where the strontium titanate film formed in Example 4 was applied to an capacitor insulation film of the DRAM.

First, as shown in FIG. 9A, a thermally-oxidized film was formed on a p-type silicon substrate 101 having monocrystalline silicon having a specific resistivity of 4 to 5 Ω.cm and a (100) plane, followed by patterning, thereby forming an insulation film 102 for isolation and a gate insulation film 103. Subsequently, a first n$^+$-type polycrystalline silicon film to be used as a gate electrode 104 was formed on the silicon substrate 101, followed by patterning by means of conventional photolithography and etching, thereby forming the gate electrode 104 on the gate insulation film 103.

As a next step, n$^-$-type source drain diffusion layers 105a and 105b were formed in a self aligning manner by implanting donor ions into the silicon substrate 101 with the gate electrode 104 as a mask. Subsequently, a thick oxide film 106 as a first interlayer insulation film was formed over the entire surface of the silicone substrate by the CVD method, followed by patterning by means of conventional photolithography and etching, thereby forming an opening communicating with the source drain diffusion layer 105a. Subsequently, tungstensilicide was deposited on the silicon oxide film 106 and in the aforementioned opening, followed by patterning by means of conventional photolithography and etching, thereby forming a bit wire 107. Thereafter, a silicon oxide film 108 as a second interlayer insulation film, was formed by means of CVD.

As shown in FIG. 9B, after the opening communicating with the source drain diffusion layer 105a was formed, a second n$^+$-type polycrystalline silicon film 109 was formed over the entire surface of the silicon substrate, and then, the second n$^+$-type polycrystalline silicon film 109 was allowed to remain only in the opening which connected to the source drain diffusion layer 105b, by the etchback method.

Subsequently, a TiN film 110 was formed over the entire surface of the silicon substrate, followed by patterning to a predetermined form by means of conventional photolithography and etching. Further, a Pt film 111 as a lower electrode (storage electrode) was formed selectively only on the TiN film 110, by means of, for example, plating. The Pt film 111 may be formed by an alternative way in which the film formed by the sputtering method is subjected to patterning by means of etching. Thereafter, an SrTiO$_3$ film 112 as a capacitor insulation film was formed over the entire surfaces of the Pt film 111 and the silicon oxide film 108 in the same method as shown in Example 4.

Finally, as shown in FIG. 9C, a TiN film to be an upper electrode (plate electrode) 113 was formed on the SrTiO$_3$ film 112 by the sputtering method, followed by patterning by means of conventional photolithography and etching, thereby forming an upper electrode 113. In this way, a basic structure of a memory cell was completely formed. Thereafter, the DRAM was manufactured in accordance with a manufacturing process of a conventional LSI, through a passivation film forming step, a wire forming step, and the like.

Figure 10A:
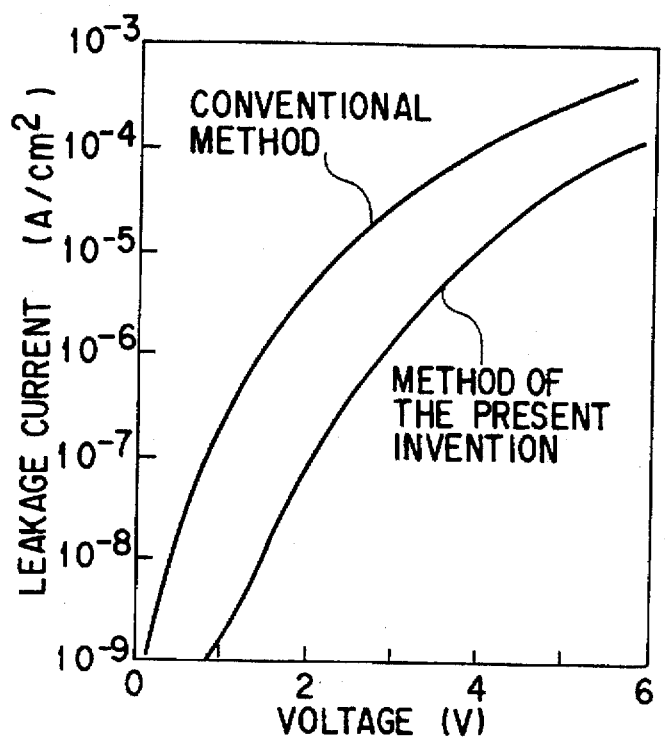
FIG. 10A is a graph showing the relationship between the voltage and the leak current and FIG. 10B is a graph showing the relationship between the voltage and the volume per unit area.
Figure 10B:
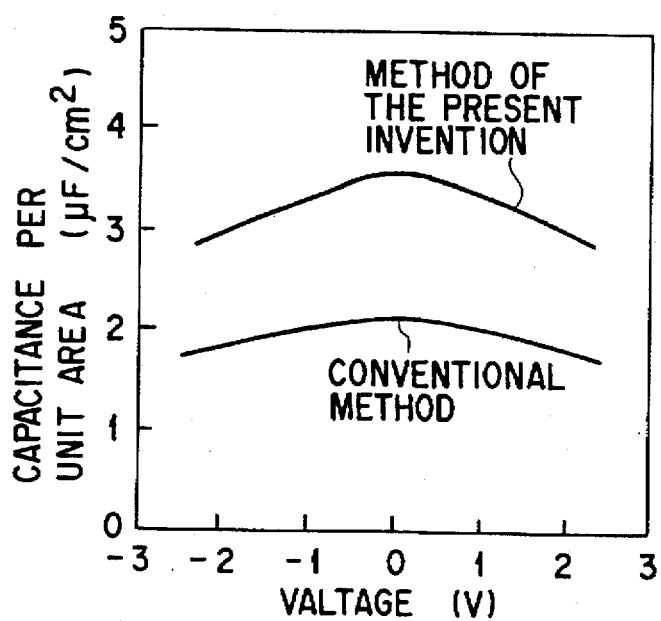

FIGS. 10A and FIG. 10B respectively show the I-V curves (the relationship between the leak current and the voltage) and the C-V curves (the relationship between capacitance per unit area and the voltage) of the capacitors using the strontium titanate films obtained by the aforementioned method and by a conventional method. As is apparent from FIG. 10A, the leak current can be reduced according to the method of this Example. Further, as shown in FIG. 10B, capacitance (dielectric constant) can be increased according to the method of the present invention.

In this Example, a case was explained where the strontium titanate ($SrTiO_3$) film was used as a material for a capacitor insulation film. However, the same effect as this can be expected if, for example, a film made of a material such as PZT having a high dielectric constant is used as a capacitor insulation film. The electrode material is not restricted to Pt or TiN. Other electrode materials can be used as the electrode material. Further, the capacitor structure is not also limited to a stacked capacitor structure. The present invention can be applied to a trench capacitor structure.

(EXAMPLE 6)

Figure 11A:
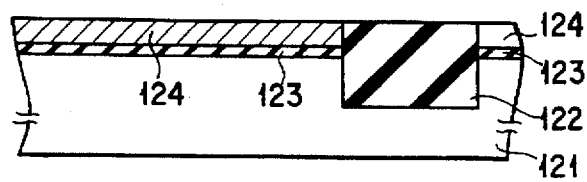
FIGS. 11A, 11B, 11C, 11D and 11E are cross-sectional views showing a manufacturing process of the DRAM according to Example 6 of the present invention.

FIGS. 11A to 11e are cross-sectional views showing a manufacturing process of the DRAM according to Example 6 of the present invention. First, as shown in FIG. 11A, a thermal oxide film 123 was formed by thermal oxidation on a silicon substrate 121 composed of monocrystalline silicon having a specific resistivity of 4 to 5 $\Omega.cm$ and a (100) plane and then, a polycrystalline silicon film 124 and a silicon oxide film (not shown) were deposited thereon by the CVD method. Subsequently, patterning by means of conventional photolithography and etching was applied to the aforementioned silicon oxide film. The polycrystalline silicon film 124, the silicon oxide film 123, and the silicon substrate 121 were anisotropically etched in successive order with the thus-obtained silicon oxide film as a mask, thereby forming a groove to be used as an isolation area. Thereafter the silicon oxide film used as the mask was removed, and then, the silicon oxide film 122 as an insulation film for isolation was embedded in the above-mentioned groove by the LPCVD method.

Figure 11B:
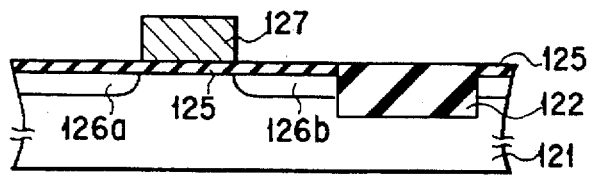

As shown in FIG. 11B, the polycrystalline silicon film 124 was stripped off by the chemical dry-etching method, and subsequently the silicon oxide film 123 was removed with hydrofluoric acid or the like. At this moment, the silicon oxide film 122 was simultaneously etched and the surface thereof become approximately equal to the surface of the substrate 121 in level. Thereafter, a thin silicon oxide film 125 as a gate oxide film was formed by thermal oxidation, and then, an $n^+$-type polycrystalline silicon film was formed over the entire surface of the silicon substrate 121 by the LPCVD method, followed by patterning by means of conventional photolithography and etching, thereby forming a gate electrode 127. Finally, an $n^-$-type source drain diffusion layers 126a and 126b were formed in a self-aligning manner by implanting donor ions into the silicon substrate 121 with the gate electrode 127 as a mask.

Figure 11C:
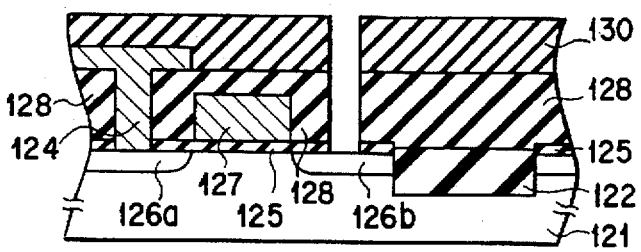

As shown in FIG. 11C, a thick silicon oxide film 128 was formed over the entire surface of the silicon substrate by the CVD method, followed by patterning by means of conventional photolithography and etching, thereby forming an opening communicating with the source drain diffusion layer 126a. Subsequently, a tungsten-silicide film was formed on the silicon oxide film 128 and in the opening, followed by patterning by means of conventional photolithography and etching, thereby forming a bit wire 129. After a silicone oxide film 130 was formed over the entire surface of the silicon substrate by CVD, the silicon oxide films 128 and 130 were patterned by means of conventional photolithography and etching, thereby forming an opening communicating with the source drain diffusion layer 126b.

Figure 11D:
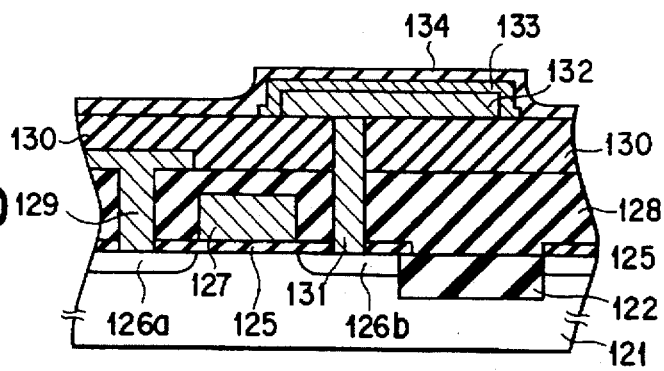

As shown in FIG. 11D, an $n^+$-type polycrystalline silicon film 131 was formed by the LPCVD method and allowed to remain only in the opening on the source drain diffusion layer 126b by the etchback method. Subsequently, a TiN film 132 was formed over the entire surface of the silicon substrate 121 by the sputtering method, followed by patterning by means of conventional photolithography and etching, thereby forming a lower electrode. Thereafter, a niobium-added strontium titanate film 133 was formed over the entire surface of the silicon substrate 121 by the CVD method. The niobium-added strontium titanate film 133 was formed from $Sr(hfa)_2$, $Ti(iso-OC_3H_7)_4$, and $Nb(OC_2H_5)_5$ supplied as precursors for Sr, Ti, and Nb at a flow rate of 100 sccm, 40 sccm, and 1 to 2% of the total flow rate, respectively to the process chamber with the Ar carrier gas. The temperature and the pressure of the process chamber in this film formation process, were set to 150° C. and 1 Torr, respectively. Further in this process, a methanol ($CH_3OH$) gas was converted into a plasma state by discharge of the microwave of 2.45 GHz in frequency and 50W in power to generate OH free-radicals. The generated OH free radicals were supplied to the process chamber together with the above-mentioned raw material gases.

The niobium-added strontium titanate film 133 was then processed by the reactive ion-etching method and allowed to remain only on the lower electrode 132. Thereafter, a strontium titanate film 134 as a capacitor insulation film was formed over the entire surface of the silicon substrate by the CVD method. The strontium titanate film 134 was formed from $Sr(hfa)_2$ and Ti $(iso-OC_3H_7)_4$ supplied precursors for Sr and Ti at a flow rate of 100 sccm and 40 sccm, respectively to the process chamber with the Ar carrier gas. The temperature and the pressure of the process chamber in this film formation process were set to 150° C. and 1 Torr, respectively. A mixed gas of oxygen gas (flow rate: 100 sccm) and water vapor (flow rate: 30 sccm) was converted into a plasma-state gas by discharge of the microwave of 2.45 GHz in frequency and 50W in power to generate OH free-radicals, which were supplied to the process chamber together with the above-mentioned precursors.

Figure 11E:
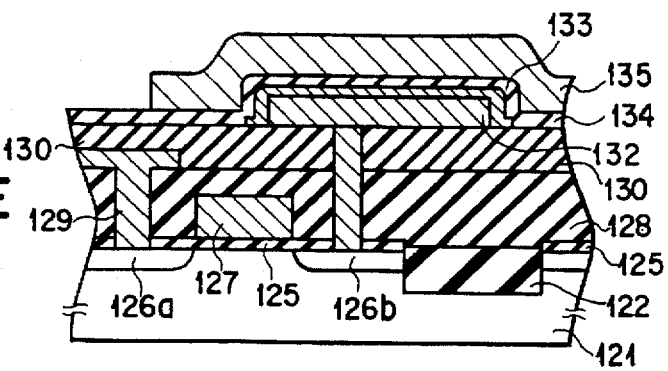

Finally, as shown in FIG. 11E, a nickel film was formed on the capacitor insulation film 134 by the sputtering method, followed by patterning, thereby forming an upper electrode 135 (plate electrode). In this way, a basic structure of a memory cell was completely formed. Thereafter, the DRAM was manufactured in accordance with a manufacturing process of a conventional LSI, through a passivation film forming step, a wire forming step, and the like.

The thus-obtained DRAM was excellent since it had a capacitor insulation film containing less contamination with impurity atoms. This is because halogen atoms such as fluorine atoms and carbonate ions were suppressed to bind to a metal by the OH free-radicals.

Figure 13:
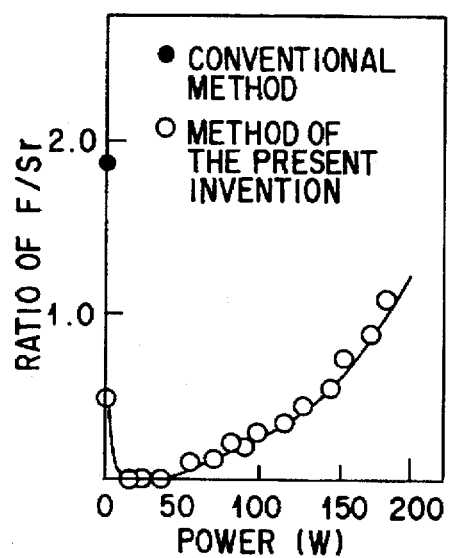
FIG. 13 is a graph showing the relationship between power and the ratio of fluorine (F)/strontium (Sr).

For example, FIG. 13 shows the relationship between the film formation condition and the ratio of fluorine (F)in-take (expressed in terms of a ratio relative to strontium (Sr)), when a strontium titanate film is formed from an $Sr(hfa)_2$ gas as precursor while the OH free-radicals obtained through conversion of above mixed gas into a plasma state, is supplied to a process chamber. In FIG. 13, the power of the microwave applied for maintaining the water vapor/oxygen in the plasma state is plotted on the axis of the abscissas. As is apparent from FIG. 13, the fluorine atoms are removed by supplying a plasma-state hydroxyl group which has been converted from the mixed gas by applying a power in a range of 10 to 100 W. In contrast, the effect of removing fluorine atoms was not observed in the strontium titanate obtained by a conventional method in which an oxygen gas is used as an oxidizing agent.

From FIG. 13, it is found that fluorine atoms can be completely removed from the metal oxide film by increasing the power of the microwave. However, when the microwave power is further increased, the fluorine atoms again show a tendency to remain in the film. This is caused by further dissociation of the OH radicals into oxygen atoms and hydrogen atoms. The dissociation of the OH radicals decreases the ability to remove fluorine atoms from the film. This phenomenon demonstrates that the effect of removing halogen atoms such as fluorine atoms is brought by the presence of the OH radicals.

From the foregoing, according to the present invention, the metal oxide film as an capacitor insulation film having the perovskite-type crystal structure in good order, can be formed. Such a metal oxide film realizes a capacitor excellent in electron holding ability, attaining a DRAM of high reliability.

(EXAMPLE 7)

Figure 12A:
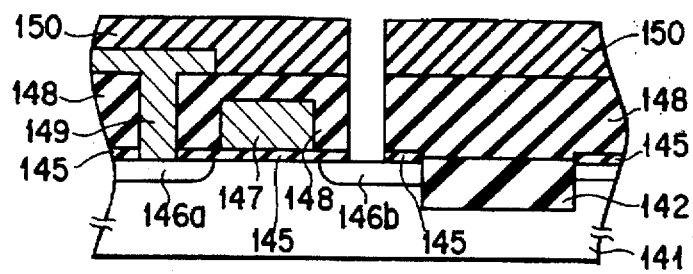
FIGS. 12A, 12B and 12C are cross-sectional views showing a manufacturing process of the DRAM according to Example 7 of the present invention.
Figure 12B:
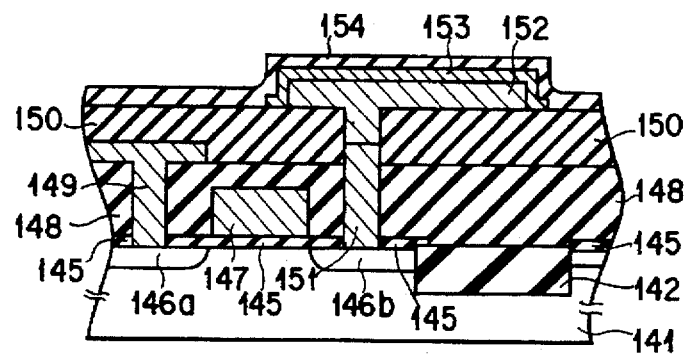
Figure 12C:
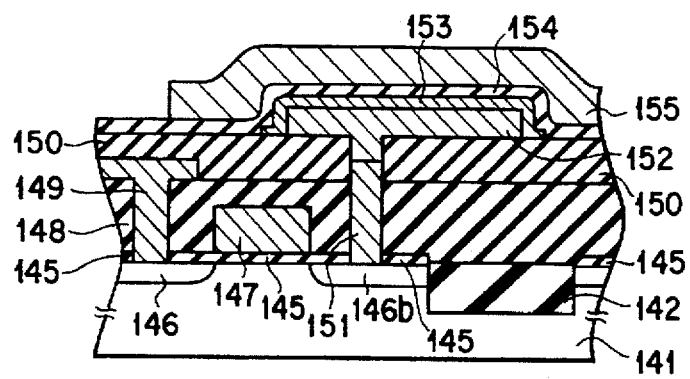

FIGS. 12A to 12C are cross-sectional views showing a manufacturing process of the DRAM according to Example 7 of the present invention.

As shown in FIG. 12A, an insulation film 142 for isolation on a silicone substrate 141, a gate insulation film 145, a gate electrode 147, source drain area 146a and 146b, a silicon oxide film 148 as a first interlayer insulation film, an opening communicating with the source drain area 146a and a bit wire 149 were formed in successive order in the same manner as in Example 6. Thereafter, a thick silicon oxide film 150 as a second interlayer insulation film was formed by the CVD method, and then, an opening communicating with the source drain area 146b was formed.

As shown in FIG. 12B, after an n$^+$-type polycrystalline silicon film 151 was formed by the LPCVD method, the film 151 was allowed to remain only in the opening on the source drain area 146b, by the etchback method. Subsequently, a tungsten film 152 was selectively allowed to grow over the n$^+$-type polycrystalline silicon film 151 by the CVD method and purposely permit it to partly project over the silicon oxide film 150, thereby forming a lower electrode. Thereafter, a Pt film 153 was formed over the entire surface of the silicon substrate by the sputtering method, and then, the Pt films 153 was allowed to remain only on the tungsten film 152 by the active ion-etching method.

Subsequently, a barium titanate film 154 as a capacitor insulation film was formed over the entire surface of the silicon substrate by the CVD method. The barium titanate film 154 was formed from of Ba(hfa)$_2$ and Ti (iso-OC$_3$H$_7$)$_4$ (TIP) as precursors for Ba and Ti supplied with Ar carrier gas at a flow rate of 100 sccm and 40 sccm, respectively to the process chamber. In this film formation process, the inner temperature and pressure of the process chamber were set to 220° C. and 1 Torr, respectively.

A mixture of ethyl alcohol gas (C$_2$H$_5$OH)(a flow rate of 30 sccm) and an oxygen gas (a flow rate of 50 sccm) was converted to a plasma-state by microwave discharge of 2.45 GHz in frequency and 200 W in power to generate OH free-radicals and oxygen atoms, which were provided together with the above-mentioned raw material gases into the process chamber. The fluorine atoms and carbon atoms in the barium titanate film 154 were removed by the thus-supplied OH free-radicals. The oxygen atoms supplied can repair the defects such as oxygen vacancies in the barium titanate film 154. In this way, a barium titanate film having a high dielectric constant can be obtained.

Finally, as shown in FIG. 12C, a niobium film was formed over the entire surface of the silicon substrate by the sputtering method, followed by patterning by means of conventional photolithography and etching, thereby forming an upper electrode 155. In this way, a basic structure of a memory cell was completely formed. Thereafter, the DRAM was manufactured in accordance with a manufacturing process of a conventional LSI, through a passivation film forming step, a wire forming step, and the like.

The present invention is not restricted to the aforementioned Examples. For example, in the Examples, the film-formation as to the case of a strontium titanate film and a barium titanate film was explained. However, the present invention can be applied to forming other metal oxide films having a high dielectric constant, for example, a calcium titanate film, or a metal oxide film consisting of a mixture of strontium titanate, barium titanate, and calcium titanate. To be more specific, the present invention can be applied to a metal oxide film having a high dielectric constant, formed of a substance containing at least one selected from the group consisting of St, Ba, Ca, Y, Cu, Ti, and Bi. Further, the present invention can be applied to forming a metal oxide film having a high dielectric constant formed of PZT, PLZT, and a tantalum oxide, Furthermore, the present invention can be applied to a metal oxide film as a superconducting film having the perovskite-type crystal structure.

In the Examples, although ethyl alcohol and methyl alcohol are used as a source for hydroxyl groups or OH free-radicals, other alcohols may be used. In addition, compounds other than the alcohols can be employed if they contain OH. Further, a DRAM is explained by way of example of a semiconductor device in the Examples, however, the present invention can be applied to other semiconductor devices requiring an insulation film having a high dielectric constant. Various modifications can be applied to the present invention as long as they do not depart from the scope of the present invention.

As explained in the foregoing, the present invention provides a method of forming a metal oxide film by the chemical vapor deposition method using a gas comprising a metal compound, thermally stable, having relatively high vapor pressure, and containing at least one of carbon atom and halogen atoms. By the method, the contamination of the metal oxide film with impurities such as carbon atoms and halogen atoms can be suppressed. Hence, by the CVD method, it is possible to stably form an excellent metal oxide film of the perovskite-type crystal structure having, for example, a high dielectric constant and a good insulation property, accompanying with a good coating property. By using this film as an capacitor insulation film of integrated circuits, a capacitor having a high electron holding ability can be obtained, thereby realizing highly reliable semiconductor devices.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method of forming a metal oxide film comprising the steps of:

introducing a gas containing a metal compound selected from the group consisting of acetyl acetonate series organometallic complex compounds, into a process chamber accommodating a substrate;

introducing a gas containing an alcohol having a hydroxyl group and an organic group into said process chamber directly;

introducing a gas containing oxygen which has been converted to a plasma state, into said process chamber; and reacting said organometallic complex compound with said alcohol and said oxygen which has been converted to a plasma state to form the metal oxide film on the substrate within the process chamber.

2. The method according to claim 1, wherein said gas containing an alcohol is introduced to said process chamber in at least two times the amount of said gas containing a metal compound.

3. The method according to claim 1, wherein said metal oxide film is made of a material having a perovskite-type crystal structure.

4. The method according to claim 3, wherein said material having a perovskite-type crystal structure is a metal titanate containing at least one metal selected from the group consisting of strontium, barium, and calcium.

5. The method according to claim 1, wherein said metal oxide film is made of a superconducting material.

6. The method according to claim 1, wherein said organometallic complex compound is at least one selected from the group consisting of $Sr(dpm)_2$ and $Ba(dpm)_2$.

7. The method according to claim 1, wherein said metal oxide film is at least one selected from the group consisting of a strontium oxide film, a barium oxide film, a calcium oxide film, and a titanium oxide film.

8. The method according to claim 1, wherein said organic group is removed by means of said oxygen which has been converted to a plasma state.

9. A method of forming a metal oxide film comprising the steps of:

introducing a gas containing a metal acetyl acetonate containing halogen into a process chamber accommodating a substrate;

preparing a mixed gas including a gas containing a compound having a hydroxyl group and a gas containing oxygen;

exciting said mixed gas at a power sufficient to generate hydroxyl free radicals but insufficient to dissociate said hydroxyl radicals into oxygen and hydrogen atoms, to produce a plasma;

introducing the mixed gas in the plasma state into said process chamber, wherein said hydroxyl free radicals act to suppress binding of fluorine atoms from said metal acetyl acetonate to a metal; and forming the metal oxide film on the substrate.

10. The method according to claim 9, wherein said compound having a hydroxyl group is $H_2O$.

11. The method according to claim 9, wherein said metal oxide film is made of a superconducting material.

12. The method according to claim 9, wherein said organometallic complex compound is at least one selected from the group consisting of $Sr(hfa)_2$ and $Ba(hfa)_2$.

13. The method according to claim 9, wherein said metal oxide film is made of a material having a perovskite-type crystal structure.

14. The method according to claim 13, wherein said material having a perovskite-type crystal structure is a metal titanate containing at least one metal selected from the group consisting of strontium, barium, and calcium.

15. The method according to claim 9, wherein said halogen is fluorine.

16. A method of forming a metal oxide film comprising the steps of:

introducing a gas containing a metal compound selected from the group consisting of halogen-containing acetyl acetonate series organometallic complex compounds, into a process chamber accommodating a substrate;

introducing a gas containing an alcohol having a hydroxyl group and an organic group into said process chamber directly;

introducing a gas containing oxygen which has been converted to a plasma state, into said process chamber; and reacting said organometallic complex compound with said alcohol and said oxygen which has been converted to a plasma state to form the metal oxide film on the substrate within process chamber.

17. The method according to claim 16, wherein said gas containing an alcohol is introduced to said process chamber in at least two times the amount of said gas containing a metal compound.

18. The method according to claim 16, wherein said metal oxide film is made of a material having a perovskite-type crystal structure.

19. The method according to claim 18, wherein said material having a perovskite-type crystal structure is a metal titanate containing at least one metal selected from the group consisting of strontium, barium and calcium.

20. The method according to claim 16, wherein said metal oxide film is made of a superconducting material.

21. The method according to claim 16, wherein said metal oxide film is at least one selected from the group consisting of a strontium oxide film, barium oxide film, a calcium oxide film, and a titanium oxide film.

22. The method according to claim 16, wherein said halogen is fluorine.

23. The method according to claim 16, wherein said organic group is removed by means of said oxygen which has been converted to a plasma state.

* * * * *